(12) United States Patent
Knaus

(10) Patent No.: US 9,026,350 B1
(45) Date of Patent: May 5, 2015

(54) CENTER OF GRAVITY DETERMINATION APPARATUS FOR FIXED WING AERIAL SYSTEMS

(71) Applicant: Bradley Tecumseh Knaus, Charleston, SC (US)

(72) Inventor: Bradley Tecumseh Knaus, Charleston, SC (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/668,616

(22) Filed: Nov. 5, 2012

(51) Int. Cl.
*G01M 1/12* (2006.01)
*G06F 17/50* (2006.01)

(52) U.S. Cl.
CPC ........... *G01M 1/125* (2013.01); *G06F 17/5095* (2013.01)

(58) Field of Classification Search
CPC .................................................. G06F 17/5095
See application file for complete search history.

(56) References Cited

PUBLICATIONS

C.G. Machine™ Assembly Instructions (2004). C.G. Machine™. Great Planes Model Manufacturing, Urbana, Illinois.*

* cited by examiner

*Primary Examiner* — John Q Nguyen
*Assistant Examiner* — Michael Kerrigan
(74) *Attorney, Agent, or Firm* — SPAWAR Systems Center Pacific; Kyle Eppele; Stephen E. Baldwin

(57) ABSTRACT

A Center of Gravity Determination Apparatus for Fixed Wing Aerial Systems (NC#102046) comprising a lifting support structure designed to support a fixed wing aerial system (FWAS) wherein the lifting support structure allows the FWAS to freely pitch, a 3-D translation mechanism, operatively coupled to the lifting support structure, designed to precisely position the lifting support structure in the x-axis, y-axis and z-axis, a base support structure, operatively coupled to the 3-D translation mechanism, designed to support other components, at least one resting support structure, operatively coupled to the base support structure, designed to support the FWAS when the lifting support structure is not providing support to the FWAS and wherein the at least one resting support structure is designed to prevent the FWAS from pitching, rolling, or yawing when the lifting support structure is not providing support to the FWAS.

19 Claims, 5 Drawing Sheets

CENTER OF GRAVITY DETERMINATION APPARATUS FOR FIXED WING AERIAL SYSTEMS

FEDERALLY SPONSORED RESEARCH AND DEVELOPMENT

This invention (Navy Case No. 102,046) is assigned to the United States Government and is available for licensing for commercial purposes. Licensing and technical inquiries may be directed to the Office of Research and Technical Applications, Space and Naval Warfare Systems Center, Code 7.0—CTO, P.O. Box 190022, N. Charleston, S.C., 29419; voice (843) 218-4000; email T2@spawar.navy.mil. Reference Navy Case Number 102046.

BACKGROUND OF THE INVENTION

The Center of Gravity Determination Apparatus for Fixed Wing Aerial Systems is generally in the field of center of gravity determination devices. The location of the center of gravity for fixed wing aerial systems is extremely important for flight performance. If the center of gravity is too far forward, the fixed wing aerial system may not be able to climb in altitude. Conversely, if the center of gravity is too far back, the fixed wing aerial system may not be able to descend in altitude. Also, autopilot functions are adversely affected in a fixed wing aerial system having an unbalanced center of gravity.

Typical center of gravity determination devices for fixed wing aerial systems rely upon imprecise and non-repeatable methods to determine a center of gravity. This is especially problematic when attempting to determine a center of gravity for fixed wing aerial systems having interchangeable payloads. Specifically, a fixed wing aerial system is designed for optimal center of gravity location for the fixed wing aerial system's manufacturer specification payload. When a non-manufacturer specification payload (e.g., aftermarket custom payload) is used, the center of gravity location may change, which will most likely adversely impact performance.

Thus, a need exists for a center of gravity determination device for fixed wing aerial systems that is precise and repeatable, which will allow a user to determine a differential in center of gravity for fixed wing aerial systems having interchangeable payloads.

BRIEF DESCRIPTION OF THE DRAWINGS

All FIGURES are not drawn to scale.

DETAILED DESCRIPTION OF THE INVENTION

Described herein is Center of Gravity Determination Apparatus for Fixed Wing Aerial Systems

DEFINITIONS

The following acronym(s) are used herein:
Acronym(s):
COGDA—Center of Gravity Determination Apparatus
DBC—Differential-By-Comparison
FWAS—Fixed Wing Aerial System
PC—Payload Calibration The center of gravity determination apparatus (COGDA) includes a base support structure, a 3-D translation mechanism, a lifting support structure, a measurement means, a resting support structure, and a leveling means. In one embodiment, the 3-D translation mechanism comprises a vertical translation mechanism, a horizontal x-axis translation mechanism, and a horizontal y-axis translation mechanism. In one embodiment, the COGDA further includes an arresting support structure. A method for calibrating a center of gravity of a fixed wing aerial system (FWAS) using a COGDA is also described.

Figure 1:
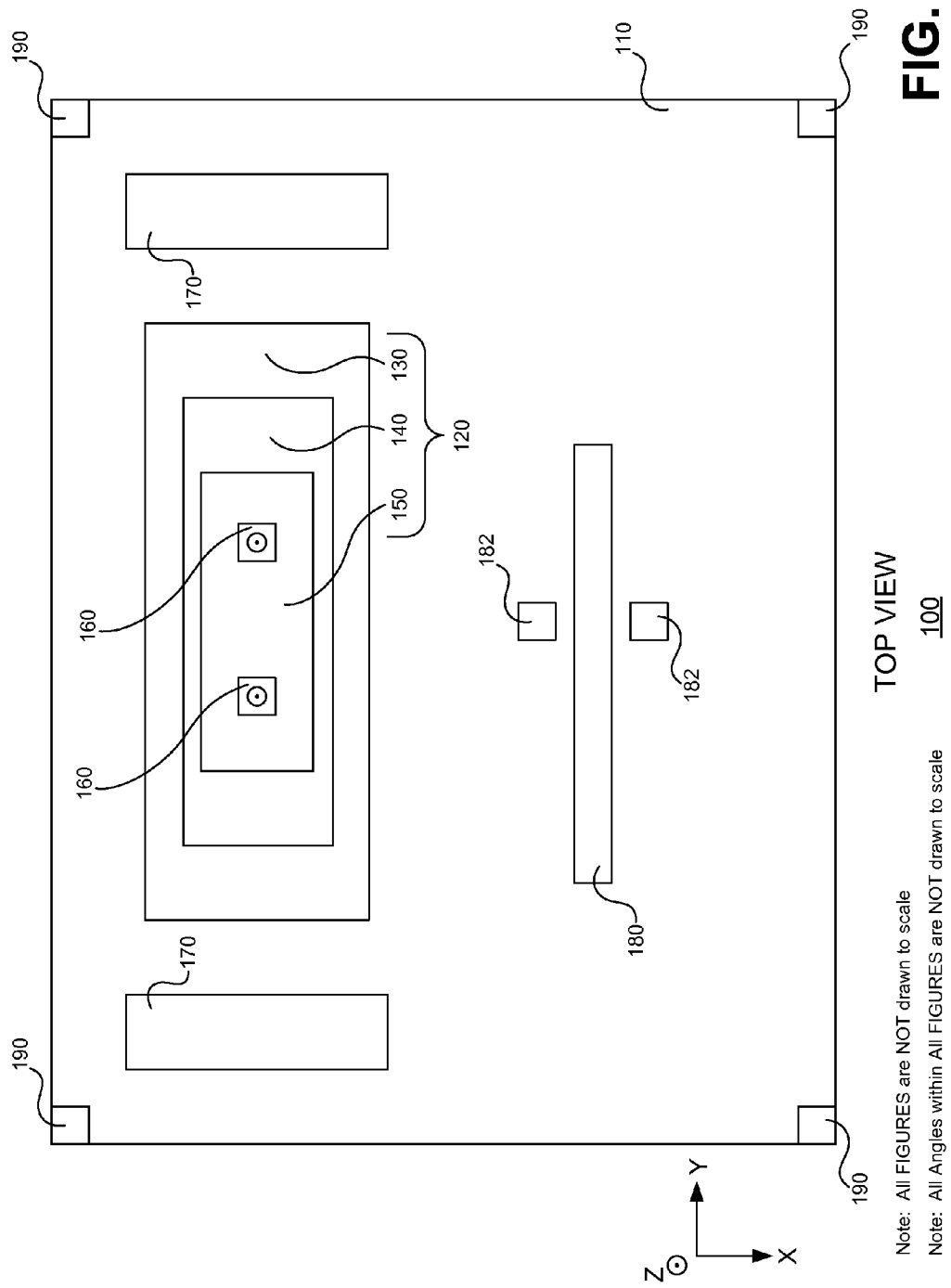
FIG. 1 is a top view of one embodiment of a Center of Gravity Determination Apparatus for Fixed Wing Aerial Systems.

FIG. 1 is a top view of one embodiment of a Center of Gravity Determination Apparatus for Fixed Wing Aerial Systems. As shown in FIG. 1, COGDA 100 includes base support structure 110, 3-D translation mechanism 120, lifting support structure 160, resting support structure 170, arresting support structure 180, measurement means 182, and leveling means 190. Lifting support structure 160 is designed to support a fixed wing aerial system wherein lifting support structure 160 allows the FWAS to freely pitch, but not to freely roll or yaw. Lifting support structure 160 comprises a rigid material such as plastic, metal, carbon fiber, wood, composite board, stone, granite, gypsum board, cardboard, and the like. In one embodiment, lifting support structure 160 comprises a pin-type structure oriented with a smallest point being the highest point in the positive z-axis. In one embodiment, lifting support structure 160 comprises a frustum structure oriented with a smallest face being the highest point in the positive z-axis. In one embodiment, lifting support structure 160 comprises a pair of lifting support structures designed to operatively couple with a fuselage of a fixed wing aerial system. In one embodiment, lifting support structure 160 comprises a pair of lifting support structures designed to vary the distance between them relative to a y-axis to accommodate fuselages of varying widths.

3-D translation mechanism 120 is operatively coupled to lifting support structure 160. 3-D translation mechanism 120 is designed to precisely position lifting support structure 160 in the x-axis, y-axis, and z-axis relative to a fixed reference point such as the center of base support structure 110 with respect to the x-y plane. In one embodiment, 3-D translation mechanism 120 is capable of positioning lifting support structure 160 with an accuracy of 0.001 of an inch. 3-D translation mechanism 120 comprises any means for precisely positioning lifting support structure 160 in the x-axis, y-axis, and z-axis relative to a fixed reference. In one embodiment, 3-D translation mechanism 120 comprises a y-axis translation means, an x-axis translation means, and a z-axis translation means. The y-axis translation means is designed to position lifting support structure 160 so that it may operatively couple to a fuselage of a FWAS so that the fuselage is evenly supported so that it does not roll or yaw. The x-axis translation means is designed to position lifting support structure 160 so that a center of gravity of a FWAS may be located.

The z-axis translation means is designed to lift a FWAS off of resting support structure 170 to allow a determination of a center of gravity of the FWAS. 3-D translation mechanism 120 is operatively coupled to and supported by base support structure 110.

In one embodiment, 3-D translation mechanism 120 comprises vertical translation mechanism 130, horizontal y-axis translation mechanism 140, and horizontal x-axis translation mechanism 150. Vertical translation mechanism 130 comprises any means for precisely positioning lifting support structure 160 in the z-axis relative to a fixed reference such as an x-y plane. In one embodiment, vertical translation mechanism 130 comprises a pneumatic mechanism. In one embodiment, vertical translation mechanism 130 comprises a hydraulic mechanism. In one embodiment, vertical translation mechanism 130 comprises a mechanical mechanism. In one embodiment, vertical translation mechanism 130 comprises ThorLabs® heavy duty lab jack (part #L490). In one embodiment, vertical translation mechanism 130 comprises a motorized mechanism for powering a translation mechanism (e.g., vertical translation mechanism 130). In one embodiment, vertical translation mechanism 130 comprises a manual mechanism for powering a translation mechanism such as a mechanical screw, a hand pump, and a hand crank.

Horizontal y-axis translation mechanism 140 comprises any means for precisely positioning lifting support structure 160 in the y-axis relative to a fixed reference such as an x-z plane. In one embodiment, horizontal y-axis translation mechanism 140 comprises a pneumatic mechanism. In one embodiment, horizontal y-axis translation mechanism 140 comprises a hydraulic mechanism. In one embodiment, horizontal y-axis translation mechanism 140 comprises a mechanical mechanism. In one embodiment, horizontal y-axis translation mechanism 140 comprises ThorLabs® single axis translation stage (part #PT1). In one embodiment, horizontal y-axis translation mechanism 140 comprises a motorized mechanism for powering a translation mechanism (e.g., horizontal y-axis translation mechanism 140). In one embodiment, horizontal y-axis translation mechanism 140 comprises a manual mechanism for powering a translation mechanism such as a mechanical screw, a hand pump, and a hand crank.

Horizontal x-axis translation mechanism 150 comprises any means for precisely positioning lifting support structure 160 in the x-axis relative to a fixed reference such as a y-z plane. In one embodiment, horizontal x-axis translation mechanism 150 comprises a pneumatic mechanism. In one embodiment, horizontal x-axis translation mechanism 150 comprises a hydraulic mechanism. In one embodiment, horizontal x-axis translation mechanism 150 comprises a mechanical mechanism. In one embodiment, horizontal x-axis translation mechanism 150 comprises ThorLabs® single axis translation stage (part #PT1). In one embodiment, horizontal x-axis translation mechanism 150 comprises a motorized mechanism for powering a translation mechanism (e.g., horizontal x-axis translation mechanism 150). In one embodiment, horizontal x-axis translation mechanism 150 comprises a manual mechanism for powering a translation mechanism such as a mechanical screw, a hand pump, and a hand crank.

Figure 2:
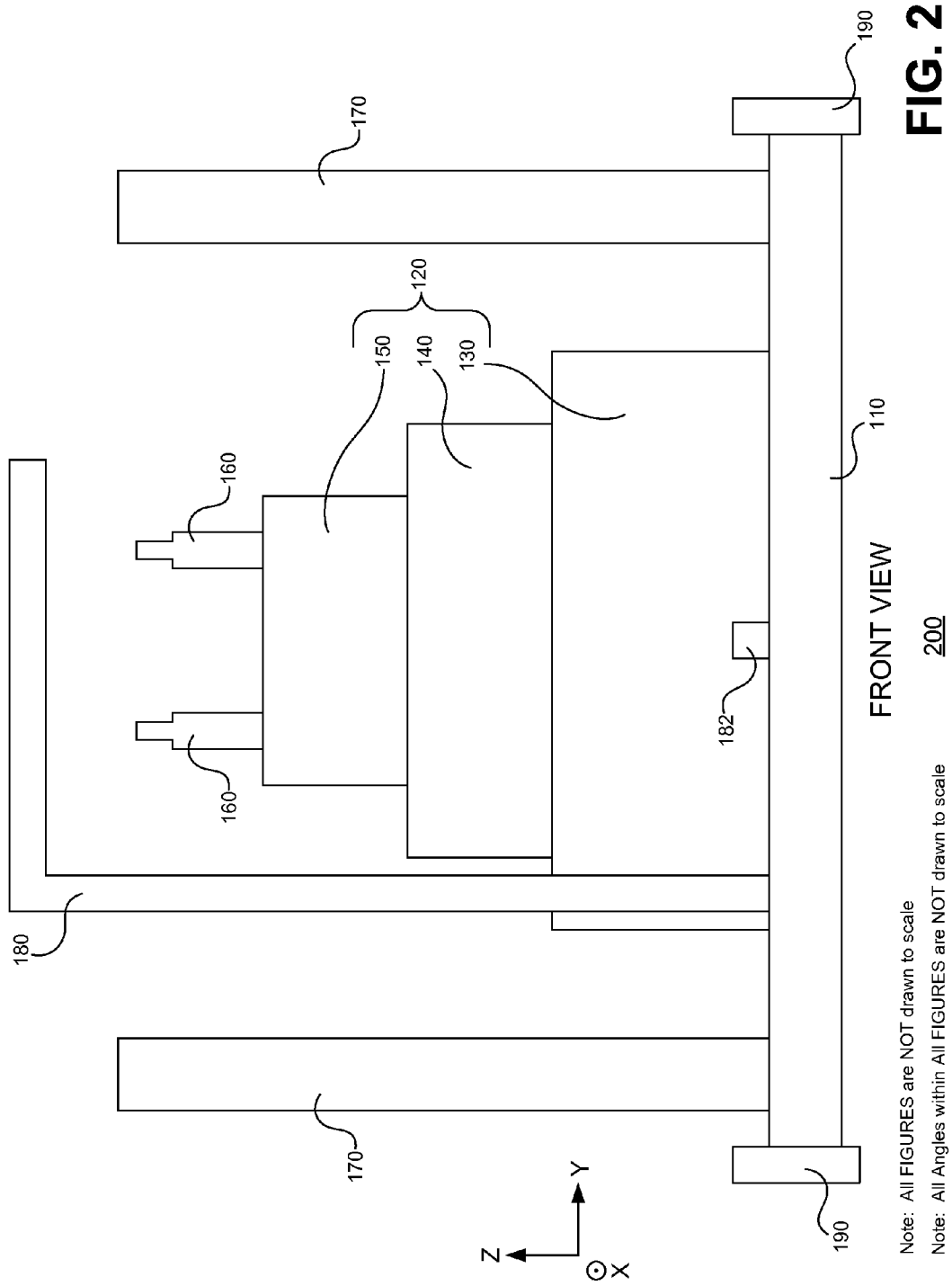
FIG. 2 is a front view of one embodiment of a Center of Gravity Determination Apparatus for Fixed Wing Aerial Systems.
Figure 3:
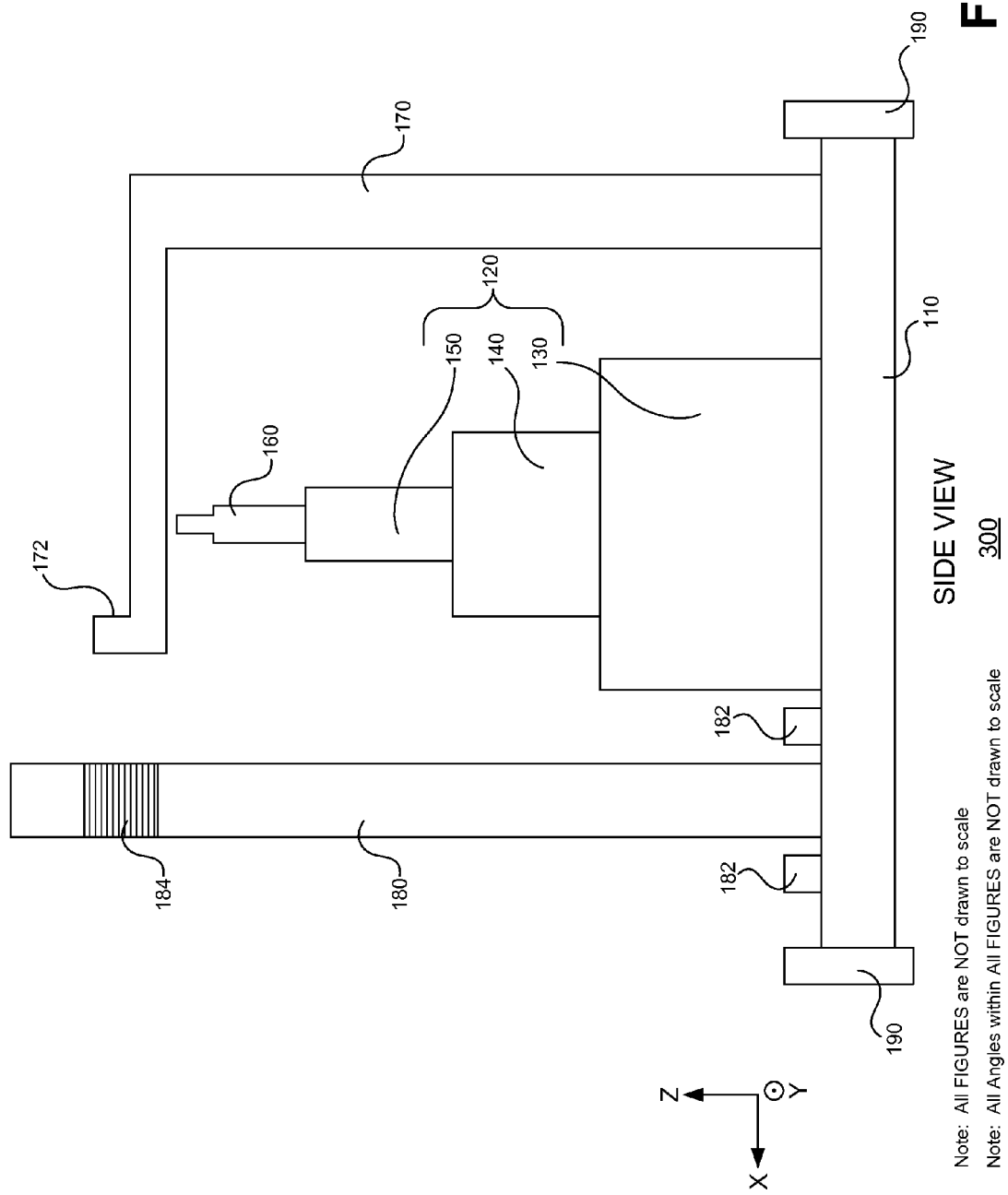
FIG. 3 is a side view of one embodiment of a Center of Gravity Determination Apparatus for Fixed Wing Aerial Systems.

As shown in FIGS. 1-3, lifting support structure 160 is operatively coupled to horizontal x-axis translation mechanism 150; horizontal x-axis translation mechanism 150 is operatively coupled to horizontal y-axis translation mechanism 140; horizontal y-axis translation mechanism 140 is operatively coupled to vertical translation mechanism 130; and vertical translation mechanism 130 is operatively coupled to base support structure 110. One of ordinary skill in the art shall recognize that the stacking order of translation mechanisms 130, 140, 150 may be changed without losing any functionality of 3-D translation mechanism 120. For example, in one embodiment, lifting support structure 160 is operatively coupled to vertical translation mechanism 130; vertical translation mechanism 130 is operatively coupled to horizontal y-axis translation mechanism 140; horizontal y-axis translation mechanism 140 is operatively coupled to horizontal x-axis translation mechanism 150; and horizontal x-axis translation mechanism 150 is operatively coupled to base support structure 110.

Base support structure 110 is designed to operatively couple to other components of COGDA 100 to provide support for them. Base support structure 110 comprises a rigid material such as plastic, metal, carbon fiber, wood, composite board, stone, granite, gypsum board, cardboard, and the like. In one embodiment, base support structure 110 comprises a rectangular board. In one embodiment, base support structure 110 comprises ThorLabs® 14046-001 Rev C Aluminum 6"×24.5"×0.25"-20 MB624.

Leveling means 190 is operatively coupled to base support structure 110 and is designed to provide a means to level base support structure 110 relative to an x-z plane and a y-z plane. In one embodiment, leveling means 190 comprises four screws operatively coupled to base support structure 110 with one screw operatively coupled to each of the corners of base support structure 110. Exemplary leveling means include pneumatic jacks, ratchet jacks, hydraulic jacks, and screw jacks. In one embodiment, leveling means 190 further comprises a level indicator such as a construction level. In one embodiment, a construction level is used in conjunction with leveling means 190 to level base support structure 110.

Measurement means 182 is operatively coupled to base support structure 110. Measurement means 182 is designed to determine a pitch angle of a FWAS or a set of distances between a FWAS and a fixed reference line (e.g., z-axis of base support structure 110), which may be used to calculate a pitch angle of a FWAS. In one embodiment, measurement means 182 comprises a protractor. In one embodiment, measurement means 182 comprises a pair of laser measurement devices. In one embodiment, a pitch angle is determined. For example, a first distance between base support structure 110 and a bottom of a FWAS at a first location is compared to a second distance between base support structure 110 and a bottom of a FWAS at a second location. If the first distance is equal to the second distance, then the FWAS has a zero pitch angle. Otherwise, the FWAS has a non-zero pitch angle. In another embodiment, a general purpose computer receives the distances and calculates a pitch angle using well-known geometry techniques such as the Pythagorean theorem and sine function of right triangles.

Measurement means 184 is operatively coupled to arresting support structure 180 and is comprised of a series of horizontal lines (e.g., a ruler). Measurement means 184 is designed to provide a horizontal reference to a FWAS when the FWAS is lifted from resting support structure 170. For example, a FWAS has a zero pitch angle if the FWAS is aligned with a horizontal line of measurement means 184. If a FWAS has a non-zero pitch angle, the FWAS may be rebalanced until the FWAS has a zero pitch angle. In one embodiment, measurement means 184 comprises a protractor operatively coupled to arresting support structure 180 for determining a pitch angle of a FWAS.

Figure 4:
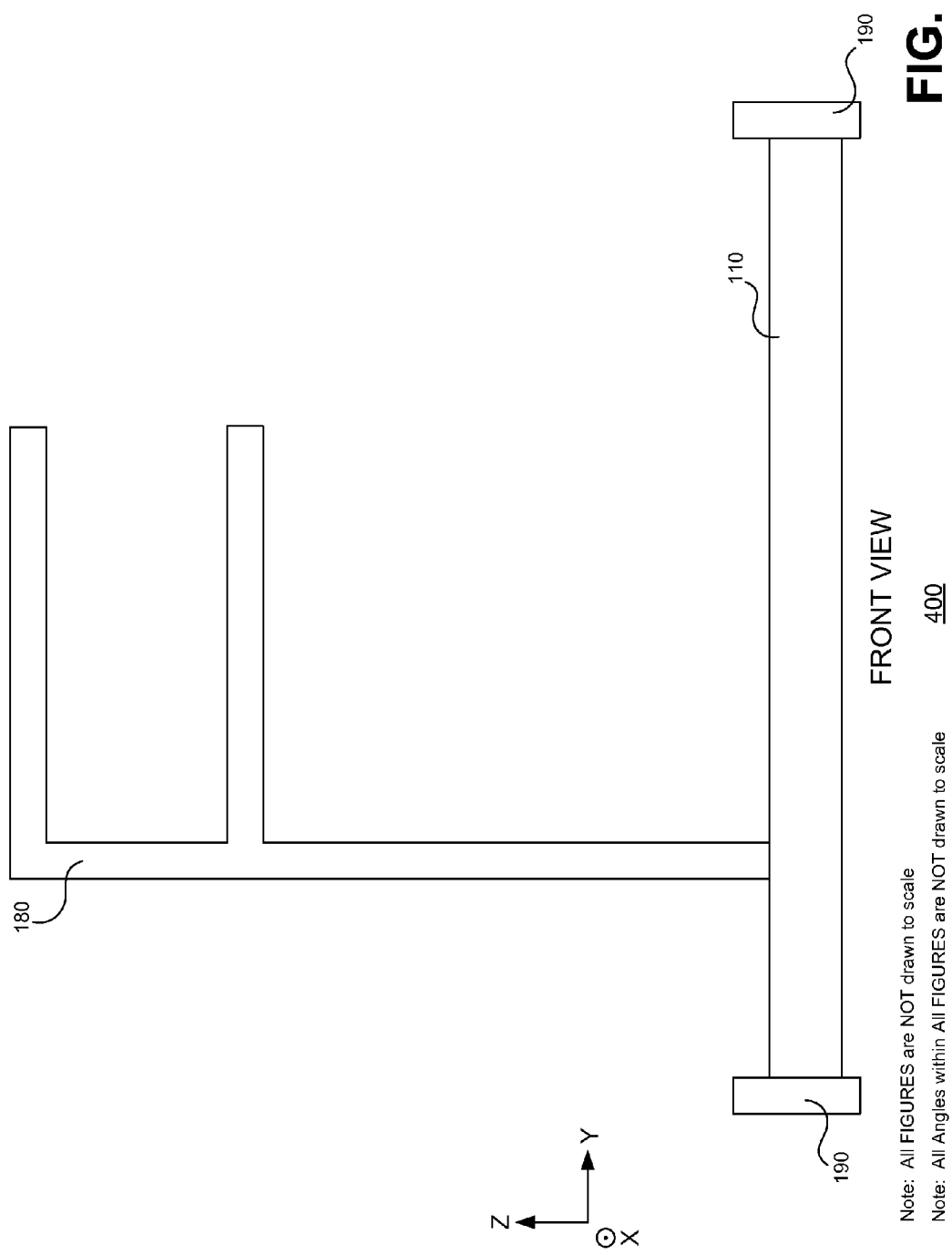
FIG. 4 is a front view of one embodiment of one component of a Center of Gravity Determination Apparatus for Fixed Wing Aerial Systems.

Arresting support structure 180 is operatively coupled to base support structure 110. Arresting support structure 180 is designed to prevent a FWAS from pitching beyond a predetermined angle when lifting support structure 160 is providing support for the FWAS. In one embodiment, arresting support structure 180 is designed to receive a nose of a FWAS wherein the nose is prevented from pitching above the highest point of arresting support structure 180. Arresting support structure 180 comprises a rigid material such as plastic, metal, carbon fiber, wood, composite board, stone, granite, gypsum board, cardboard, and the like. In one embodiment, as shown in FIG. 2, arresting support structure 180 comprises an upside-down, L-shaped structure. In one embodiment, the predetermined angle is plus 15 degrees. In one embodiment, the predetermined angle is plus 10 degrees. In one embodiment, the predetermined angle is plus 5 degrees. In one embodiment, the predetermined angle is plus 3 degrees. In one embodiment, the predetermined angle is plus 1 degree. In one embodiment, as shown in FIG. 4 and described below, arresting support structure 180 comprises an F-shaped structure.

Resting support structure 170 is operatively coupled to base support structure 110. Resting support structure 170 comprises a rigid material such as plastic, metal, carbon fiber, wood, composite board, stone, granite, gypsum board, cardboard, and the like. Resting support structure 170 is designed to provide support for a FWAS when lifting support structure 160 is not providing support to the FWAS. Resting support structure 170 is also designed to prevent a FWAS from pitching, rolling, or yawing when lifting support structure 160 is not providing support to the FWAS. In one embodiment, resting support structure 170 comprises a pair of resting support structures designed to provide support for each wing of a FWAS. In one embodiment, resting support structure 170 comprises a pair of rectangular blocks designed to provide support for each wing of a FWAS. Resting support structure 170 is further designed to provide a reference point for a FWAS when lifting support structure 160 is not providing support to the FWAS. For example, when each wing of a FWAS is resting on resting support structure 170, each wing is marked to align with reference point 172 of resting support structure 170. Thus, repeatable measurements are possible. For example, a FWAS having each wing marked to align with reference point 172 may be positioned on resting support structure 170 in the same position prior to lifting support structure 160 raising the FWAS off of resting support structure 170.

FIG. 2 is a front view of one embodiment of a Center of Gravity Determination Apparatus for Fixed Wing Aerial Systems. FIG. 2 is substantially similar to FIG. 1, and thus, identical components are not described again. As shown in FIG. 2, COGDA 200 includes base support structure 110, 3-D translation mechanism 120, lifting support structure 160, resting support structure 170, arresting support structure 180, measuring means 182, and leveling means 190. In one embodiment, 3-D translation mechanism 120 comprises vertical translation mechanism 130, horizontal y-axis translation mechanism 140, and horizontal x-axis translation mechanism 150.

FIG. 3 is a side view of one embodiment of a Center of Gravity Determination Apparatus for Fixed Wing Aerial Systems. FIG. 3 is substantially similar to FIGS. 1-2, and thus, identical components are not described again. As shown in FIG. 3, COGDA 300 includes base support structure 110, 3-D translation mechanism 120, lifting support structure 160, resting support structure 170, arresting support structure 180, measurement means 184, and leveling means 190. In one embodiment, 3-D translation mechanism 120 comprises vertical translation mechanism 130, horizontal y-axis translation mechanism 140, and horizontal x-axis translation mechanism 150.

FIG. 4 is a front view of one embodiment of an arresting support structure 180 of a Center of Gravity Determination Apparatus for Fixed Wing Aerial Systems. As shown in FIG. 4, COGDA 400 includes base support structure 110 and arresting support structure 180. Other components (e.g., 3-D translation mechanism 120, lifting support structure 160, and resting support structure 170) of COGDA 400 are not shown in FIG. 4 for purposes of clarity and are shown and described in FIGS. 1-3 and their corresponding description above.

As shown in FIG. 4, one embodiment of arresting support structure 180 comprises an F-shaped structure. Arresting support structure 180 is operatively coupled to base support structure 110. Arresting support structure 180 is designed to prevent a FWAS from pitching beyond a predetermined range of angles when lifting support structure 160 is providing support for the FWAS. Arresting support structure 180 comprises a rigid material such as plastic, metal, carbon fiber, wood, composite board, stone, granite, gypsum board, cardboard, and the like. In one embodiment, the predetermined range of angles is plus or minus 15 degrees. In one embodiment, the predetermined range of angles is plus or minus 10 degrees. In one embodiment, the predetermined range of angles is plus or minus 5 degrees. In one embodiment, the predetermined range of angles is plus or minus 3 degrees. In one embodiment, the predetermined range of angles is plus or minus 1 degree.

Figure 5:
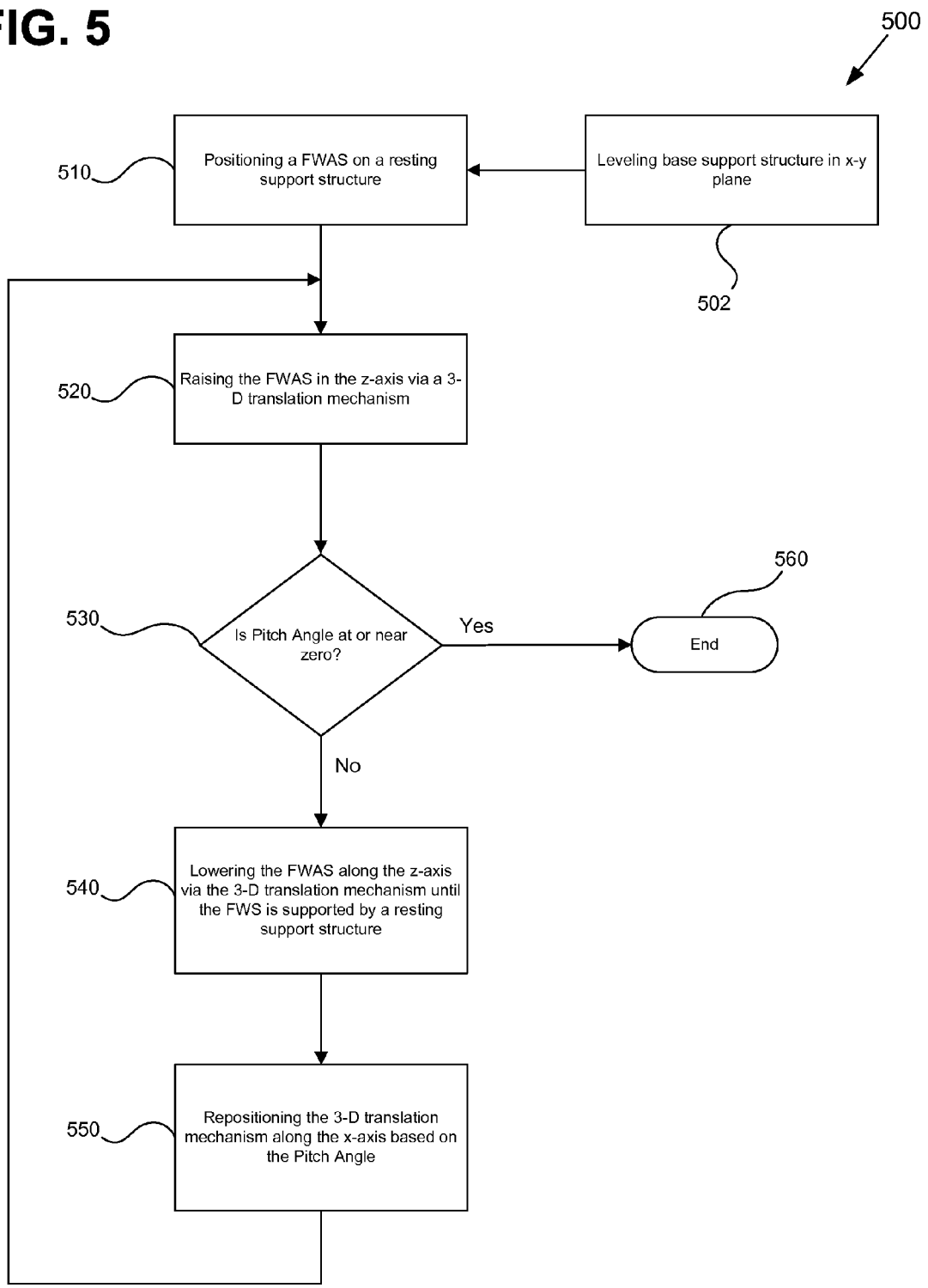
FIG. 5 is a flowchart of an exemplary method of operating a Center of Gravity Determination Apparatus for Fixed Wing Aerial Systems.

FIG. 5 is a flowchart of an exemplary method of operating a Center of Gravity Determination Apparatus for Fixed Wing Aerial Systems. While flowchart 500 is sufficient to describe one embodiment of an exemplary method of operating a Center of Gravity Determination Apparatus for Fixed Wing Aerial Systems, other embodiments may utilize procedures different from those shown in flowchart 500.

As shown in FIG. 5, the method begins at BOX 502 of flowchart 500 where the method levels base support structure 110 with respect to an x-y plane. After BOX 502, the method proceeds to BOX 510. At BOX 510 of flowchart 500, the method positions a FWAS on resting support structure 170 of COGDA 100. After BOX 510, the method proceeds to BOX 520. At BOX 520 of flowchart 500, the method raises the FWAS in the z-axis via 3-D translation mechanism 120. After BOX 520, the method proceeds to BOX 530. At BOX 530 of flowchart 500, the method determines whether the pitch angle of the FWAS is at or near zero. If the pitch angle is at or near zero, then the method proceeds to BOX 560 where the method ends. If the pitch angle is not at or near zero, then the method proceeds to BOX 540. At BOX 540 of flowchart 500, the method lowers the FWAS along the z-axis via 3-D translation mechanism 120 until the FWAS is supported by resting support structure 170. After BOX 540, the method proceeds to BOX 550. At BOX 550 of flowchart 500, the method repositions 3-D translation mechanism 120 along the x-axis based on the pitch angle. In one embodiment of BOX 550, the method repositions 3-D translation mechanism 120 in a positive x-axis direction when the pitch angle is greater than zero. In one embodiment of BOX 550, the method repositions 3-D translation mechanism 120 in a negative x-axis direction when the pitch angle is less than zero. After BOX 550, the method returns to BOX 520.

A differential-by-comparison technique for comparing a center of gravity for a first FWAS configuration to a second center of gravity for a second FWAS configuration is now described. An exemplary first FWAS configuration is a FWAS having a manufacturer specification payload. An exemplary second FWAS configuration is a FWAS having a non-manufacturer specification payload. In one embodiment of the differential-by-comparison (DBC) technique, the technique obtains a center of gravity for a first FWAS configuration using the method described with respect to flowchart 500. At the end of the method of flowchart 500, the center of gravity for the first FWAS configuration is marked on the FWAS (e.g., on the underside of the wings). The FWAS payload is changed to a second FWAS configuration. Then, the DBC technique obtains a center of gravity for the second FWAS configuration using the method of flowchart 500. At the end of the method of flowchart 500, the center of gravity for the second FWAS configuration is marked on the FWAS. The DBC technique then measures a differential between the markings for the center of gravity for the first FWAS configuration and the center of gravity for the second FWAS configuration.

A payload calibration technique for rebalancing a FWAS to improve flight performance is now described. In a first step, the payload calibration technique obtains a baseline center of gravity from a FWAS having a manufacturer specification payload. In a second step, the payload calibration technique obtains a center of gravity from a custom payload. In a third step, the center of gravity from a custom payload is compared to the baseline center of gravity. In a fourth step, the FWAS is rebalanced (e.g., the custom payload is rearranged and counterweights are added to the FWAS) and the new center of gravity is compared to the baseline center of gravity. The fourth step is repeated until the differential between the centers of gravity is below a desired threshold. In one embodiment the desired threshold is 0.01 of an inch.

In one embodiment of the payload calibration (PC) technique, the PC technique obtains a center of gravity for a FWAS having a manufacturer specification payload using the method described with respect to flowchart 500. At the end of the method of flowchart 500, the center of gravity for the FWAS having a manufacturer specification payload is marked on the FWAS (e.g., on the underside of the wings). The manufacturer specification payload is changed to a custom payload. Then, the PC technique obtains a center of gravity for the FWAS having a custom payload using the method of flowchart 500. At the end of the method of flowchart 500, the center of gravity for the FWAS having a custom payload is compared to the mark created for the FWAS having a manufacturer specification payload. If the differential between the centers of gravity is below a desired threshold, then the PC technique terminates. Otherwise, the PC technique repeats the following steps until a differential between the centers of gravity is below the desired threshold: 1) the PC technique rebalances the FWAS (e.g., rearranges the custom payload and adding counterweights to the FWAS) based on the comparison; 2) the PC technique obtains a center of gravity for the FWAS having a custom payload using the method of flowchart 500; 3) at the end of the method of flowchart 500, the center of gravity for the FWAS having a custom payload is compared to the mark created for the FWAS having a manufacturer specification payload.

What is claimed is:

1. An apparatus for a fixed wing aerial system (FWAS) having a fuselage, the apparatus, comprising:
   a lifting support structure including a pair of variably spaced apart lifting support structures for fuselages of varying width and designed to support the fixed wing aerial system at respective first and second positions operatively coupled to the fuselage relative to the center of gravity of the fixed wing system wherein said lifting support structure allows said fixed wing aerial system to freely pitch about the first and second positions on the fuselage, the pair of support structures variable in height for varying sizes of the fixed wing aerial system;
   a 3-D translation mechanism, operatively coupled to said lifting support structure, designed to precisely position said lifting support structure in the x-axis, y-axis and z-axis;
   a base support structure, operatively coupled to said 3-D translation mechanism, designed to support components of said apparatus;
   at least one resting support structure including a rigid support structure for each wing of the fixed wing aerial system, operatively coupled to said base support structure, designed to support and align each wing of said fixed wing aerial system at second positions relative to said center of gravity when said lifting support structure is not providing support to said fixed wing aerial system and wherein said at least one resting support structure is designed to prevent said fixed wing aerial system from pitching, rolling, or yawing in the x-axis, y-axis and z-axis when said lifting support structure is not providing support to said fixed wing aerial system and where the lifting support structure remains at the same first and second positions, and wherein the fixed wing aerial system has a pitch angle relative to the base support structure and further comprising a measurement means operatively coupled to the base support structure for determining the pitch angle of the fixed wing aerial system relative to the base support structure, the measurement means including a horizontal reference to the FWAS when the FWAS is lifted from the resting support structure where the horizontal reference comprises a series of horizontal reference lines and where the FWAS is aligned with one of the horizontal lines.

2. The apparatus of claim 1 further comprising an arresting support structure, operatively coupled to said base support structure, designed to prevent said fixed wing aerial system from pitching beyond a predetermined angle when said lifting support structure is providing support to said fixed wing aerial system.

3. The apparatus of claim 2, wherein said arresting support structure comprises an upside-down, L-shaped structure.

4. The apparatus of claim 2, wherein said arresting support structure comprises an F-shaped structure.

5. The apparatus of claim 2, wherein said predetermined angle is plus or minus 15 degrees.

6. The apparatus of claim 1, wherein said 3-D translation mechanism comprises a vertical 2 translation mechanism, a horizontal y-axis translation mechanism, and a horizontal x-axis translation mechanism.

7. The apparatus of claim 6, wherein said vertical translation mechanism comprises ThorLabs® heavy duty lab jack (part #L490).

8. The apparatus of claim 6, wherein said horizontal y-axis translation mechanism comprises ThorLabs® single axis translation stage (part #PT1).

9. The apparatus of claim 6, wherein said horizontal x-axis translation mechanism comprises Thor Labs® single axis translation stage (part #PT1).

10. The apparatus of claim 1, wherein said base support structure comprises ThorLabs® 14046-001 Rev C Aluminum 6"×24.5"×0.25"-20 MB624.

11. The apparatus of claim 1, wherein said base support structure consists of a material selected from the group of plastic, metal, carbon fiber, wood, composite board, stone, granite, gypsum board, and cardboard.

12. The apparatus of claim 1, wherein said base support structure comprises a rectangular board.

13. The apparatus of claim 1, wherein said at least one resting support structure comprises a pair of resting support structures designed to provide support under each wing of said fixed wing aerial system.

14. The apparatus of claim 13, wherein said pair of resting support structures comprises a pair of rectangular blocks.

15. The apparatus of claim 1, further comprising a leveling means, operatively coupled to said arresting support structure, designed to provide a means for leveling said base support structure.

16. An apparatus for a fixed wing aerial system (FWAS) having a fuselage, the apparatus, comprising:
- a lifting support structure including a pair of variably spaced apart lifting support structures for fuselages of varying width and designed to support the fixed wing aerial system at respective first and second positions relative to the center of gravity of the fixed wing system wherein said lifting support structure allows said fixed wing aerial system to freely pitch about the first and second positions on the fuselage, the pair of support structures variable in height for varying sizes of the fixed wing aerial system;
- a 3-D translation mechanism, operatively coupled to said lifting support structure, designed to precisely position said lifting support structure in the x-axis, y-axis and z-axis base support structure, operatively coupled to said 3-D translation mechanism, designed to support components of said apparatus;
- at least one resting support structure including a rigid support structure for each wing of the fixed wing aerial system, operatively coupled to said base support structure, designed to support and align each wing of said fixed wing aerial system at second positions relative to said center of gravity when said lifting support structure is not providing support to said fixed wing aerial system and wherein said at least one resting support structure is designed to prevent said fixed wing aerial system from pitching, rolling, or yawing in the x-axis, y-axis and z-axis when said lifting support structure is not providing support to said fixed wing aerial system;
- an arresting support structure, operatively coupled to said base support structure, designed to prevent said fixed wing aerial system from pitching beyond a predetermined angle when said lifting support structure is providing support to said fixed wing aerial system and where the lifting support structure remains at the same first and second positions, and wherein the fixed wing aerial system has a pitch angle relative to the base support structure and further comprising a measurement means operatively coupled to the base support structure for determining the pitch angle of the fixed wing aerial system relative to the base support structure, the measurement means including a horizontal reference to the FWAS when the FWAS is lifted from the resting support structure where the horizontal reference comprises a series of horizontal reference lines and where the FWAS is aligned with one of the horizontal lines.

17. The apparatus of claim 16, wherein said arresting support structure comprises an upside-down, L-shaped structure.

18. An apparatus for a fixed wing aerial system (FWAS) having a fuselage, the apparatus, comprising:
- a lifting support structure including a pair of variably spaced apart lifting support structures for fuselages of varying width and designed to support a fixed wing aerial system at first and second positions operatively coupled to the fuselage relative to the center of gravity of the fixed wing system wherein said lifting support structure allows said fixed wing aerial system to freely pitch, the pair of support structures variable in height for varying sizes of the fixed wing aerial system;
- a horizontal x-axis translation mechanism, operatively coupled to said lifting support structure, designed to precisely position said lifting support structure in the x-axis;
- a horizontal y-axis translation mechanism, operatively coupled to said horizontal x-axis translation mechanism, designed to precisely position said lifting support structure in the y-axis;
- a vertical translation mechanism, operatively coupled to said horizontal y-axis translation mechanism, designed to precisely position said lifting support structure in the z-axis;
- a base support structure, operatively coupled to said vertical translation mechanism, designed to support components of said apparatus;
- a leveling means, operatively coupled to said base support structure, designed to provide a means for leveling said base support structure;
- at least one resting support structure including a rigid support structure for each wing of the fixed wing aerial system, operatively coupled to said base support structure, designed to support and align each wing of said fixed wing aerial system at second positions relative to said center of gravity when said lifting support structure is not providing support to said fixed wing aerial system and wherein said at least one resting support structure is designed to prevent said fixed wing aerial system from pitching, rolling, or yawing in the x-axis, y-axis and z-axis when said lifting support structure is not providing support to said fixed wing aerial system and where the lifting support structure remains at the same first and second positions;
- an arresting support structure, operatively coupled to said base support structure, designed to prevent said fixed wing aerial system from pitching beyond a predetermined angle when said lifting support structure is providing support to said fixed wing aerial system, and wherein the fixed wing aerial system has a pitch angle relative to the base support structure and further comprising a measurement means operatively coupled to the base support structure for determining the pitch angle of the fixed wing aerial system relative to the base support structure, the measurement means including a horizontal reference to the FWAS when the FWAS is lifted from the resting support structure where the horizontal reference comprises a series of horizontal reference lines and where the FWAS is aligned with one of the horizontal lines.

19. The apparatus of claim 18, wherein said at least one resting support structure comprises a pair of resting support structures designed to provide support under each wing of said fixed wing aerial system.

* * * * *